US008557041B1

(12) United States Patent
Chen et al.

(10) Patent No.: US 8,557,041 B1
(45) Date of Patent: Oct. 15, 2013

(54) METHOD FOR MANUFACTURING P-I-N MICROCRYSTALLINE SILICON STRUCTURE FOR THIN-FILM SOLAR CELLS

(75) Inventors: Yu-Hung Chen, Hsinchu (TW);
Jun-Chin Liu, Hsinchu (TW);
Chun-Heng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/549,049

(22) Filed: Jul. 13, 2012

(30) Foreign Application Priority Data

Apr. 20, 2012 (TW) .............................. 101114082 A

(51) Int. Cl.
*C30B 23/00* (2006.01)
*C30B 29/06* (2006.01)
*C30B 29/00* (2006.01)
*C30B 25/14* (2006.01)
*H01L 21/67* (2006.01)

(52) U.S. Cl.
CPC .................. *C30B 23/00* (2013.01); *C30B 29/06* (2013.01); *C30B 29/00* (2013.01); *C30B 25/14* (2013.01); *H01L 21/67253* (2013.01)
USPC .................................... 117/84; 117/92; 438/7

(58) Field of Classification Search
CPC ...................................................... C30B 23/00
USPC ........................................ 117/84, 92; 438/7
See application file for complete search history.

(56) References Cited

U.S. PATENT DOCUMENTS 5,676,765 A * 10/1997 Saito et al. .................... 136/258
6,121,541 A 9/2000 Arya (Continued)

FOREIGN PATENT DOCUMENTS

JP 2000174310 A 6/2000
TW 200933917 A 8/2009

(Continued)

OTHER PUBLICATIONS

"Effects of the Addition of SiF4 to the SiH4 Feed Gas for Depositing Polycrystalline Silicon Films at Low Temperature", Moniruzzaman Sved, Takao Inokuma, Yoshihiro Kurata and Seiichi Hasegawa, Jpn. J. Appl. Phys. vol. 36 (1997) pp. 6625-6632, Part 1, No. 11, Nov. 1997.*
Heya et al., "Control of Polycrystalline Silicon Structure by the Two-Step Deposition Method", Japanese Journal of Applied Physics, vol. 39, pp. 3888-3895, 2000.
Ide et al., "2-Step Growth Method and Microcrystalline Silicon Thin Film Solar Cells Prepared by Hot Wire Cell Method",Japanese Journal of Applied Physics, vol. 43, No. 5A, pp. 2419-2424, 2004.
Ishihar et al., Preparation of High-Quality Microctystalline Silicon from Fluorinated Precursors by a Layer-by-Layer Technique, Japanese Journal of Applied Physics, vol. 32, pp. 1539-1545, 1993.

(Continued)

*Primary Examiner* — Michael Kornakov
*Assistant Examiner* — Hua Qi
(74) *Attorney, Agent, or Firm* — Rabin & Berdo, P.C.

(57) ABSTRACT

A method for manufacturing a P-I-N microcrystalline silicon structure for thin-film solar cells, includes the steps of: (a) forming a P-type layer; (b) forming an I-type layer including a plurality of sub-layers successively stacked on the P-type layer using gas mixtures including fluoride and hydride that have different gas ratios, respectively; and (c) forming an N-type layer on the I-type layer. First, second, and third I-type sub-layers may be formed on the P-type layer using gas mixtures including fluoride and hydride at a first, second, and third gas ratios, respectively. Then, advantageously, the third gas ratio may be larger than the second gas ratio and the second gas ratio may be larger than the first gas ratio, and the first gas ratio may be 8%, the second gas ratio may range between 15% and 35%, and the third gas ratio may range between 35% and 50%.

11 Claims, 1 Drawing Sheet

(56) References Cited

U.S. PATENT DOCUMENTS

| | | | |
|---|---|---|---|
| 7,919,398 B2 | 4/2011 | Chae et al. | |
| 2011/0121945 A1* | 5/2011 | Murdoch et al. | 340/10.1 |
| 2011/0201145 A1 | 8/2011 | Miyahara et al. | |

FOREIGN PATENT DOCUMENTS

| | | |
|---|---|---|
| TW | 200939508 A | 9/2009 |
| TW | 201011934 A | 3/2010 |
| TW | 201121065 A | 6/2011 |

OTHER PUBLICATIONS

Ali et al., "Structural and Optical Properties of Nanocrystalline Silicon Films Deposited by Plasma-Enhanced Chemical Vapor Depositon", Japanese Journla of Applied Physics-vol. 41, pp. 169-175, 2001.

Mao et al., "Hot-wire Chemical Vapor Deposition and Characterizaton of Polycrystalline Silicon Thin Films using a two-step growth method", Materials Chemistry and Physics, vol. 126, pp. 665-668, 2011.

\* cited by examiner

METHOD FOR MANUFACTURING P-I-N MICROCRYSTALLINE SILICON STRUCTURE FOR THIN-FILM SOLAR CELLS

CROSS-REFERENCE TO RELATED APPLICATIONS

This application claims priority to Taiwanese Patent Application No. 101114082, filed on Apr. 20, 2012.

BACKGROUND

1. Technical Field

The present disclosure relates to P-I-N microcrystalline silicon structures and methods for manufacturing the structures, and, more particularly, to a P-I-N microcrystalline silicon structure of thin-film solar cells and a method for manufacturing the structure.

2. Description of Related Art

In a traditional P-I-N microcrystalline silicon structure of thin-film solar cells, the I-type layer is manufactured in a single step by mixing gas sources $SiH_4$ and $H_2$, wherein the amount of doped $H_2$ in the total gas mixture is relatively high (for example, $SiH_4:H_2$ is 1:40), in order to enhance the crystallinity of the I-type layer. However, when the amount of the doped hydrogen is too high, the crystallinity will not increase accordingly. As a result, Voc and FF will drop, causing deterioration in efficiency of the component. Moreover, too much hydrogen is likely to cause damage in the P-type layer provided under the I-type layer.

A technique in which the I-type layer is formed through a single step with a gas mixture of $SiF_4$, $SiH_4$ and $H_2$ has been proposed, whereby increasing nucleation of the I-type layer. Nonetheless, the erosion rate of fluoride is even higher than that of hydrogen, so despite that nucleation is increased through the single step with the addition of $SiF_4$, the degree of damage caused at the interface between the I-type and P-type layers is widened, and internal defects in the I-type layer are also increased.

SUMMARY

The present disclosure effectively prevents interfacial damages between the I-type layer and the P-type layer, and reduces the internal defects in the I-type layer.

The present disclosure provides a method for manufacturing a P-I-N microcrystalline silicon structure of thin-film solar cells, which includes the following steps of: (1) forming a P-type layer; (2) forming an I-type layer including a plurality of sub-layers successively stacked on the P-type layer using gas mixtures including fluoride and hydride at different gas ratios; and (3) forming an N-type layer on the I-type layer including the plurality of stacked sub-layers.

In an embodiment of the present disclosure, step (2) includes: (2-1) forming a first I-type sub-layer on the P-type layer using a gas mixture including fluoride and hydride at a first gas ratio; and (2-2) forming a second I-type sub-layer on the first I-type sub-layer using a gas mixture including fluoride and hydride at a second gas ratio, and the second gas ratio is greater than the first gas ratio.

The present disclosure also provides a P-I-N microcrystalline silicon structure of thin-film solar cells, which includes: a P-type layer; an I-type layer including a plurality of stacked sub-layers successively formed on the P-type layer using gas mixtures including fluoride and hydride at different gas ratios; and an N-type layer formed on the I-type layer including the plurality of stacked sub-layers.

In an embodiment of the present disclosure, the I-type layer including a plurality of stacked sub-layers includes: a first I-type sub-layer formed on the P-type layer using a gas mixture including fluoride and hydride at a first gas ratio; and a second I-type sub-layer formed on the first I-type sub-layer using a gas mixture including fluoride and hydride at a second gas ratio, and the second gas ratio is greater than the first gas ratio.

Therefore, the present disclosure includes forming a first I-type sub-layer having fluoride and hydride with a lower fluoride ratio on a P-type layer, then a second I-type sub-layer having fluoride and hydride with a higher fluoride ratio is formed on the first I-type sub-layer, thus forming an I-type layer in several phases, and then an N-type layer is formed on top of the I-layer, thereby effectively preventing damages to the interface between the I-type layer and the P-type layer due to excessive fluoride, and also effectively reducing the internal defects within the I-type layer.

BRIEF DESCRIPTION OF THE DRAWINGS

The present disclosure can be more fully understood by reading the following detailed description of the embodiments, with reference made to the accompanying drawings, wherein.

DETAILED DESCRIPTION OF THE EMBODIMENTS

The present disclosure is described by the following specific embodiments. Those with ordinary skills in the arts can readily understand the other advantages and functions of the present disclosure after reading the disclosure of this specification. The present disclosure can also be implemented or applied with different embodiments.

Figure 1:
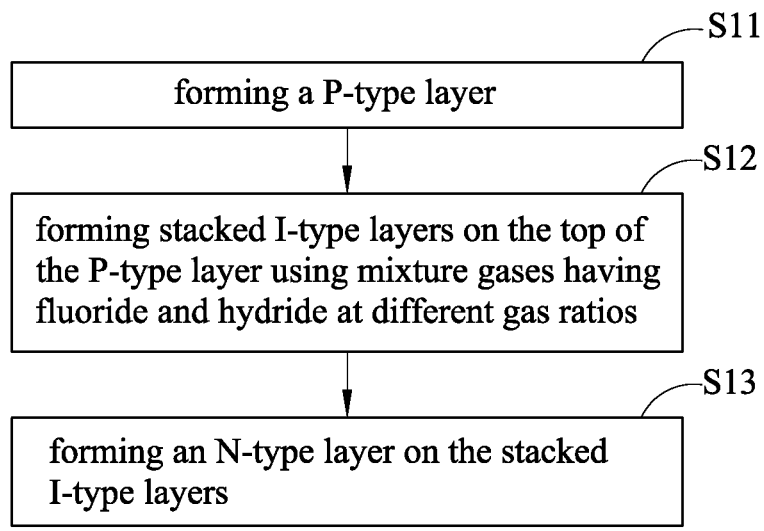
FIG. 1 is a flow chart illustrating a method for manufacturing a P-I-N microcrystalline silicon structure of thin-film solar cells provided according to the present disclosure.

Referring now a flow chart shown in FIG. 1, a method for manufacturing a P-I-N microcrystalline silicon structure of thin-film solar cells is provided to facilitate understanding thereof.

In step S11, a P-type layer is formed. More specifically, the P-type layer is formed on a substrate by a plasma-enhanced chemical vapor deposition (PECVD) technique. Then, step S12 is performed.

In step S12, an I-type layer having a plurality of sub-layers is formed on the top of the P-type sub-layer by using a plurality of gas mixtures having fluoride and hydride at different gas ratios, wherein fluoride can be one of $SiF_4$, $SF_6$, $CF_4$, $CHF_3$, $C_2F_6$, $C_3F_8$, HF, $CaF_2$, $MgF_2$, $BaF_2$ or a combination thereof, and hydride can be one of $SiH_4$ and $Si_2H_6$ or a combination thereof. The step of forming the I-type layer can be carried out with a plasma-enhanced chemical vapor deposition (PECVD) technique. Then, step S13 is performed.

In step S13, an N-type layer is formed on the top of the I-type layer having a plurality of sub-layers by a plasma-enhanced chemical vapor deposition (PECVD) technique.

In an embodiment, in step S12 of forming an I-type layer having a plurality of sub-layers on the top of the P-type layer by using a plurality of gas mixtures having fluoride and hydride gases at different ratios, a first I-type sub-layer can be formed on the P-type layer using a gas mixture having fluoride and hydride at a first gas ratio, and then a second I-type sub-layer can be formed on the first I-type sub-layer using a gas mixture having fluoride and hydride at a second gas ratio greater than the first ratio.

Figure 2:
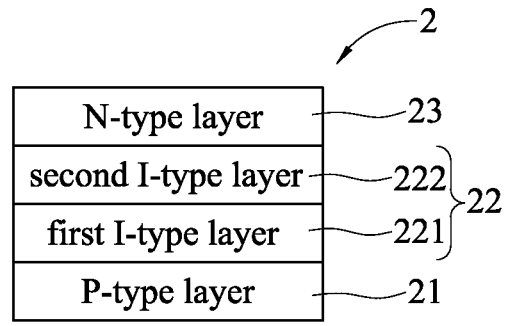
FIG. 2 is a schematic diagram depicting a P-I-N microcrystalline silicon structure of thin-film solar cells provided according to the present disclosure.

For example, as shown in FIG. 2, once a P-type layer 21 is formed, a first I-type sub-layer 221 is formed on the P-type layer 21 using a gas mixture having fluoride and hydride (e.g., $SiF_4/SiH_4$) at a gas ratio of 8%, and then a second I-type sub-layer 222 is formed on the first I-type sub-layer 221 using a gas mixture having $SiF_4/SiH_4$ at a gas ratio of 30%, thereby forming an I-type layer 22 in a P-I-N microcrystalline silicon structure with the stacked first I-type sub-layer 221 and second I-type sub-layer 222.

Furthermore, in an embodiment, in step S12, a first I-type sub-layer can be formed on the P-type layer using a gas mixture having fluoride and hydride at a first gas ratio, then a second I-type sub-layer can be formed on the first I-type sub-layer using a gas mixture having fluoride and hydride at a second gas ratio greater than the first gas ratio, and finally a third I-type sub-layer can be formed on the second I-type sub-layer using a gas mixture having fluoride and hydride at a third gas ratio greater than the second ratio.

Figure 3:
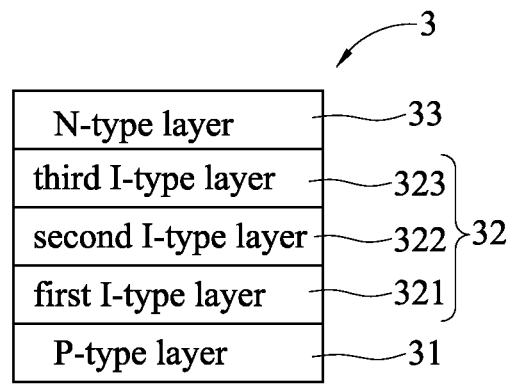
FIG. 3 is a schematic diagram depicting another P-I-N microcrystalline silicon structure of thin-film solar cells provided according to the present disclosure.

For example, as shown in FIG. 3, once a P-type layer 31 is formed, a first I-type sub-layer 321 is formed on the P-type layer 31 using a gas mixture having fluoride and hydride (e.g., $SiF_4/SiH_4$) at a gas ratio of 8%, then a second I-type sub-layer 322 is formed on the first I-type sub-layer 321 using a gas mixture having $SiF_4/SiH_4$ at a gas ratio of 16%, and finally a third I-type sub-layer 323 is formed on the second I-type sub-layer 322 using a gas mixture having $SiF_4/SiH_4$ at a gas ratio of 24%, thereby forming an I-type layer 32 in a P-I-N microcrystalline silicon structure with the stacked first I-type sub-layer 321, the second I-type sub-layer 322 and third I-type sub-layer 323.

In addition, in an embodiment, the concentration of fluorine in the gas mixture having fluoride and hydride at the first gas ratio is between $1E15 \text{ cm}^{-3}$ and $1E21 \text{ cm}^{-3}$. The crystallinity of the first I-layers 221 and 321 can be between 45% and 80%. The gas mixtures can also contain a specific amount of $H_2$. In actual implementations, the steps of forming sub I-layers can be added to increase the number of layers according to different requirements.

P-I-N microcrystalline silicon structures of thin-film solar cells provided according to the present disclosure can thus be those shown in FIGS. 2 and 3.

As shown in FIG. 2, a P-I-N microcrystalline silicon structure of thin-film solar cells 2 includes a P-type layer 21, an I-type layer having a plurality of sub-layers formed on the P-type layer 21, and an N-type layer 23 formed on the top of the I-type layer, wherein the plurality of sub-layers that form the I-layer are successively formed on the top of the P-type layer 21 respectively with gas mixtures having fluoride and hydride at different gas ratios.

More specifically, the plurality of sub-layers having the I-layer may include a first I-type sub-layer 221 and a second I-type sub-layer 222, wherein the first I-type sub-layer 221 is formed on the P-type layer 21 using a gas mixture having fluoride and hydride at a first gas ratio; and then the second I-type sub-layer 222 is formed on the first I-type sub-layer 221 using a gas mixture having fluoride and hydride at a second gas ratio.

As shown in FIG. 3, a P-I-N microcrystalline structure of thin-film solar cells 3 includes a P-type layer 31, an I-type layer having a plurality of sub-layers formed on the P-type layer 31 and an N-type layer 33 formed on the top of the I-type layer, wherein the plurality of sub-layers that form the I-layer are successively formed on the top of the P-type layer 31 with respectively gas mixtures having fluoride and hydride at different gas ratios.

More specifically, the plurality of sub-layers having the I-layer may include a first I-type sub-layer 321, a second I-type sub-layer 322 and a third I-type sub-layer 323, wherein the first I-type sub-layer 321 is formed on the P-type layer 31 using a gas mixture having fluoride and hydride at a first gas ratio; the second I-type sub-layer 322 is formed on the first I-type sub-layer 321 using a gas mixture having fluoride and hydride at a second gas ratio; and the third I-type sub-layer 323 is formed on the second I-type sub-layer 322 using a gas mixture having fluoride and hydride at a third gas ratio.

Similar to the technical content disclosed in the disclosure of the manufacturing method above, the gas mixture having fluoride and hydride at the first gas ratio is a gas mixture having fluoride and hydride ($SiF_4/SiH_4$) at a gas ratio of 8%, for example; the gas mixture having fluoride and hydride at the second gas ratio is a gas mixture having $SiF_4/SiH_4$ at a gas ratio ranging between 15% and 35%, for example; and the gas mixture having fluoride and hydride at the third gas ratio is a gas mixture having $SiF_4/SiH_4$ at a gas ratio ranging between 35% and 50%, for example. In other words, the third ratio is greater than the second ratio, and the second ratio is larger than the first ratio. Other examples relating to concentrations, crystallinity, and compounds and depositions techniques used are the same as those previously mentioned, so they will not be further discussed.

In summary, the present disclosure includes forming a first I-type sub-layer having fluoride and hydride with a lower fluoride ratio on a P-type layer, thereby effectively preventing damages to the interface between the I-type layer and the P-type layer. Thereafter, a second I-type sub-layer having fluoride and hydride with a higher fluoride ratio is formed on the first I-type sub-layer, or a third I-type sub-layer having fluoride and hydride with an even higher fluoride ratio is further formed on the second I-type sub-layer. Finally, an N-type layer is formed on the top of the I-layer, thereby completing a P-I-N microcrystalline silicon structure. Since the I-type layer is formed in several phases by adjusting the gas ratio of fluoride and hydride, not only the P-type layer is prevented from damage, the internal defects within the I-type layer can be effectively reduced, increasing the yield of the product.

However, the above embodiments are only used to illustrate the principles of the present disclosure, and they should not be construed as to limit the present disclosure in any way. The above embodiments can be modified by those with ordinary skill in the art without departing from the scope of the present disclosure as defined in the following appended claims.

What is claimed is:

1. A method for manufacturing a P-I-N microcrystalline silicon structure for thin-film solar cells, comprising the steps of:
   (a) forming a P-type layer;
   (b) forming an I-type layer including a plurality of I-type sub-layers successively stacked on the P-type layer, each I-type sub-layer of the plurality of I-type sub-layers being formed using a gas mixture including fluoride and hydride and having a gas ratio of fluoride to hydride that is different from other I-type sub-layers of the plurality of I-type sub-layers, respectively; and (c) forming an N-type layer on the I-type layer.

2. The method of claim 1, wherein step (b) includes:

(i) forming a first I-type sub-layer on the P-type layer using a gas mixture including fluoride and hydride at a first gas ratio; and (ii) forming a second I-type sub-layer on the first I-type sub-layer using a gas mixture including fluoride and hydride at a second gas ratio.

3. The method of claim 2, wherein step (b) further includes:

(iii) forming a third I-type sub-layer on the second I-type sub-layer using a gas mixture including fluoride and hydride at a third gas ratio.

4. The method of claim 3, wherein the third gas ratio is larger than the second gas ratio and the second gas ratio is larger than the first gas ratio.

5. The method of claim 3, wherein the third gas ratio is larger than the second gas ratio and the second gas ratio is larger than the first gas ratio, and wherein the first gas ratio is 8%, the second gas ratio ranges between 15% and 35%, and the third gas ratio ranges between 35% and 50%.

6. The method of claim 2, wherein the gas mixture used to form the first I-type sub-layer has a fluorine concentration ranging between $1E15$ $cm^{-3}$ and $1E21$ $cm^{-3}$.

7. The method of claim 2, wherein the second gas ratio is greater than the first gas ratio.

8. The method of claim 2, wherein the first I-type sub-layer has a crystallinity ranging between 45% and 80%.

9. The method of claim 1, wherein said fluoride is one of $SiF_4$, $SF_6$, $CF_4$, $CHF_3$, $C_2F_6$, $C_3F_8$, HF, $CaF_2$, $MgF_2$, $BaF_2$ or a combination thereof.

10. The method of claim 1, wherein said hydride is one of $SiH_4$ and $Si_2H_6$ or a combination thereof.

11. The method of claim 1, wherein the steps of forming the P-type layer, the I-type layer and the N-type layer are performed by a plasma-enhanced chemical vapor deposition (PECVD) technique.

* * * * *